United States Patent
Chiang et al.

(10) Patent No.: US 10,436,635 B2
(45) Date of Patent: Oct. 8, 2019

(54) ACTIVE OPTICAL COMPONENT WITH PASSIVE OPTICAL COMPONENT AND ENCAPSULANT FOR AN OPTICAL DEVICE AND ELECTRICAL DEVICE INCLUDING THE SAME

(71) Applicant: Advanced Semiconductor Engineering, Inc., Kaohsiung (TW)

(72) Inventors: Yi Wen Chiang, Kaohsiung (TW); Hsin-Ying Ho, Kaohsiung (TW); Hsun-Wei Chan, Kaohsiung (TW); Lu-Ming Lai, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 198 days.

(21) Appl. No.: 15/267,028

(22) Filed: Sep. 15, 2016

(65) Prior Publication Data
US 2017/0082485 A1   Mar. 23, 2017

Related U.S. Application Data

(60) Provisional application No. 62/219,782, filed on Sep. 17, 2015.

(51) Int. Cl.
*G01J 1/04* (2006.01)
*H01L 31/0203* (2014.01)
*H01L 33/54* (2010.01)
*H01L 33/58* (2010.01)
*H01L 31/0232* (2014.01)
(Continued)

(52) U.S. Cl.
CPC .............. *G01J 1/0411* (2013.01); *G01J 1/42* (2013.01); *H01L 25/167* (2013.01); *H01L 31/0203* (2013.01); *H01L 31/02327* (2013.01); *H01L 33/54* (2013.01); *H01L 33/58* (2013.01); *H01L 2224/48091* (2013.01); *H01L 2224/48227* (2013.01); *H01L 2224/97* (2013.01); *H01L 2924/15311* (2013.01); *H01L 2924/181* (2013.01); *H01L 2924/1815* (2013.01)

(58) Field of Classification Search
CPC ..... G01J 1/0411; G01J 1/42; H01L 31/02327; H01L 33/58; H01L 33/54; H01L 33/52; H01L 31/0203; H01L 27/14625; H01L 2924/181; H01L 2224/48227; H01L 2924/15311; H01L 2924/1815; H01L 2224/97; H01L 2224/48091
See application file for complete search history.

(56) References Cited

U.S. PATENT DOCUMENTS

| 2004/0001193 A1* | 1/2004 | Takaoka | G01C 3/085 356/3.03 |
| 2004/0101020 A1* | 5/2004 | Bhandarkar | G02B 6/4292 372/109 |

(Continued)

*Primary Examiner* — Que Tan Le
*Assistant Examiner* — Jennifer D Bennett
(74) *Attorney, Agent, or Firm* — Foley & Lardner LLP; Cliff Z. Liu

(57) ABSTRACT

An optical device includes an active optical component including an optical area, an encapsulant covering the active optical component, and a passive optical component adhered to the encapsulant above the active optical component. The passive optical component has an optical axis, and the optical axis is substantially aligned with a center of the optical area.

16 Claims, 7 Drawing Sheets

(51) Int. Cl.
*H01L 25/16* (2006.01)
*G01J 1/42* (2006.01)

(56) References Cited

U.S. PATENT DOCUMENTS

| | | | |
|---|---|---|---|
| 2005/0013562 A1* | 1/2005 | Tatehata | G02B 6/4201 385/93 |
| 2005/0073036 A1* | 4/2005 | Appelt | H01L 23/4334 257/678 |
| 2006/0022212 A1* | 2/2006 | Waitl | H01L 31/0203 257/98 |
| 2007/0091293 A1* | 4/2007 | Okuno | H01L 31/0203 356/3.01 |
| 2008/0026498 A1* | 1/2008 | Tarsa | H01L 33/58 438/26 |
| 2012/0126269 A1 | 5/2012 | Tanuma | |
| 2015/0236227 A1 | 8/2015 | Yan | |

* cited by examiner

US 10,436,635 B2

ACTIVE OPTICAL COMPONENT WITH PASSIVE OPTICAL COMPONENT AND ENCAPSULANT FOR AN OPTICAL DEVICE AND ELECTRICAL DEVICE INCLUDING THE SAME

CROSS-REFERENCE TO RELATED PATENT APPLICATIONS

This application claims the benefit of and priority to U.S. Provisional Patent Application 62/219,782 filed Sep. 17, 2015 to Chiang, titled "Lens Structure and Sensor Device," the contents of which are incorporated herein by reference in their entirety.

TECHNICAL FIELD

The present disclosure relates to an optical device, an electrical device and a passive optical component, and more particularly to a passive optical component having a light guiding portion for guiding light beams, and an optical device and an electrical device including the same.

BACKGROUND

In a sensor design in which energy is focused onto a sensing area by a lens, an efficiency of the sensor may be improved by aligning an optical axis of the lens with a central axis of the sensing area. However, manufacturing tolerances often result in misalignment of such axes, reducing a sensitivity of the sensor.

SUMMARY

In one or more embodiments, an optical device includes an active optical component including an optical area, an encapsulant covering the active optical component, and a passive optical component adhered to the encapsulant above the active optical component. The passive optical component has an optical axis, and the optical axis is substantially aligned with a center of the optical area.

In one or more embodiments, an electrical device includes a sensor including a sensing area configured to detect a light beam and responsively generate an electrical signal. The electrical device further includes an amplifier electrically connected to the sensor and configured to amplify the electrical signal, and a processing component electrically connected to the amplifier and configured to process the amplified electrical signal. An encapsulant covers the sensor, the amplifier and the processing component. A passive optical component is adhered to the encapsulant above the sensor. The passive optical component has an optical axis, and the optical axis is substantially aligned with a center of the sensing area.

In one or more embodiments, a passive optical component includes a main body including a light guiding portion and a protruding portion positioned below the light guiding portion. The passive optical component further includes a supporting structure attached to the main body. A portion of the supporting structure extends past a surface of the protruding portion to form a cavity.

Figure 1:
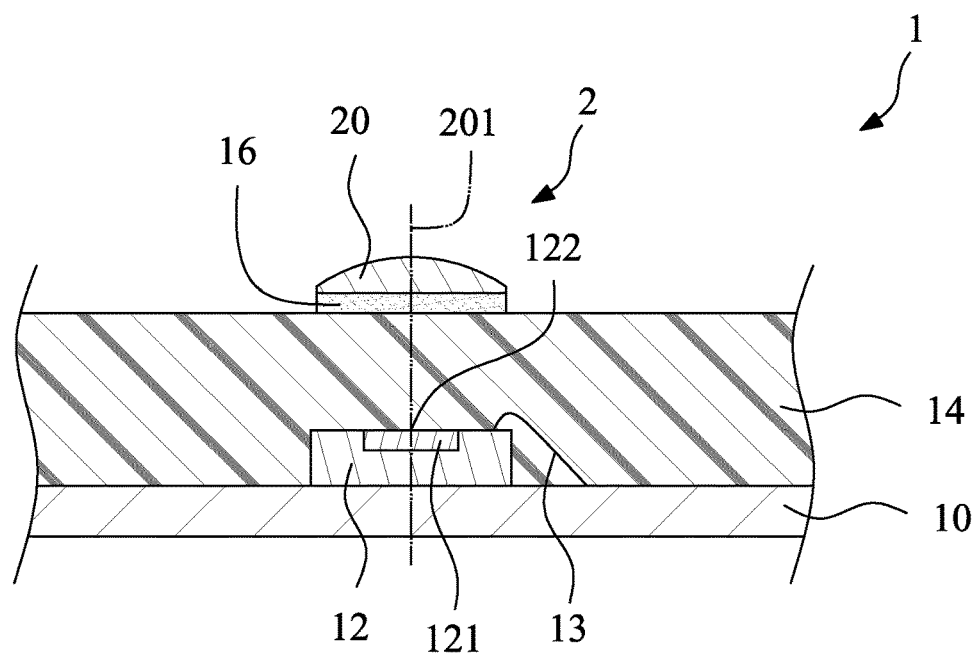
FIG. 1 depicts a cross-sectional view of an example of an optical device according to an embodiment of the present disclosure.

The following detailed description, reference is made to the accompanying drawings, which form a part hereof. In the drawings, similar symbols identify similar components. The illustrative embodiments, described in the detailed description, drawings, and the claims are not meant to be limiting. Other embodiments may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and make part of this disclosure.

DETAILED DESCRIPTION

An optical device package can include an optical device such as a sensor die that can sense incident optical signals. The sensor die can include a sensing area.

The sensor die can be bonded onto a substrate. A transfer mold may be positioned over the substrate, and a molding compound applied in the transfer mold to cover the sensor die. The transfer mold can be shaped to form an optical lens over the sensing area of the sensor die, to focus incident optical signals on the sensing area. Focusing the optical signals on the sensing area can improve an optical performance of the optical device. An optical axis of the lens may be substantially normal to a surface of the sensing area. It can be desirable to align the optical axis of the lens with a center of the sensing area. The center of the sensing area can be a geometric center or a centroid of the sensing area.

In some instances, variations or tolerances in manufacturing processes may cause the optical axis of the lens to not align with the center of the sensing area of the sensor die. The distance between a point on the surface area where the optical axis intersects the sensing area and the center of the sensing area can be referred to as an "offset." For example, a pick-and-place machine used for placing the sensor die onto the substrate may contribute to the offset. For another example, process variations (or mold tool tolerances) associated with the placement of the transfer mold (for forming the lens) over the substrate also may contribute to the offset. The two mentioned contributors to offset, one associated with pick-and-place and the other associated with the transfer mold, may together result in an offset tolerance that is greater than about 20 µm or even about 50 µm. However, to achieve desirable optical performance from the optical device, it is desirable to reduce the offset tolerance to about 20 µm or less.

One approach to reducing the offset tolerance associated with pick-and-place is to reduce alignment tolerances by improving an alignment capability of the pick-and-place machine. Similarly, offset tolerances associated with the transfer mold can be reduced by designing more precise molding tools. However, these approaches can be expensive and may increase manufacturing time of the optical devices.

In one or more embodiments, rather than using a transfer mold to form a lens over the sensing area of the optical device, a pre-formed lens is disposed over an encapsulation material that is disposed to cover the sensing device. The pre-formed lens may be attached to the encapsulation material by an adhesive gel, for example. However, voids can occur in the adhesive gel when air is trapped under the lens during placement. Such voids between the lens and the sensing area can impede, or cause redirection of, optical signals directed towards the sensing area—resulting in a loss of output power of the optical device as well as potential distortion of an optical signal.

Device packages and techniques for manufacturing the device packages discussed below reduce or minimize formation of undesirable voids between the lens and the sensing area of the optical sensor.

FIG. 1 depicts a cross-sectional view of an example of an optical device 1 according to an embodiment of the present disclosure. The optical device 1 includes a substrate 10, an active optical component 12, an encapsulant 14, an adhesive gel 16, and a passive optical component 2. The active optical component 12 is a sensor die or a light source, and is positioned on the substrate 10. In one or more embodiments in which the active optical component 12 is a sensor die, the sensor die detects optical signals, and, in response, generates corresponding electrical signals. The sensor die includes one or more optical sensors, such as photoconductive devices, photovoltaics, photodiodes, phototransistors, or a combination thereof. In one or more embodiments in which the active optical component 12 is a light source, the light source receives an electrical signal and, in response, generates an optical signal, such as an optical signal of a particular wavelength. The light source can include devices such as light emitting diodes (LEDs) or laser diodes.

In one or more embodiments, the active optical component 12 is electrically connected to the substrate 10 by at least one bonding wire 13. In other embodiments, contact pads of the active optical component 12 are connected to contact pads of the substrate 10 for electrical connection.

The active optical component 12 includes at least one optical area 121 with a center 122. In embodiments in which the active optical component 12 is a sensor die, the optical area 121 can be a sensing area for detecting a light beam. In embodiments in which the active optical component 12 is a light source, and the optical area 121 can be a light-emitting area for emitting a light beam.

The encapsulant 14 covers the active optical component 12 and a surface of the substrate 10 surrounding the area of the substrate 10 over which the active optical component 12 is positioned. In one or more embodiments, the encapsulant 14 is transparent, and allows a light beam to pass through. In one or more embodiments, the encapsulant 14 allows light having a predetermined wavelength to pass through. The encapsulant 14 may be, or may include, for example, glass, a plastic, quartz, or an epoxy.

The passive optical component 2 is adhered to the encapsulant 14 by the adhesive gel 16, and is positioned above the active optical component 12. Materials of the passive optical component 2 and the encapsulant 14 may be the same or different from each other. The passive optical component 2 is formed independently of the formation of the encapsulant 14. In one or more embodiments, a transfer molding technique may be used to form the passive optical component 2. The passive optical component 2 includes at least one lens 20 having at least one optical axis 201 corresponding to the geometric center of the lens 20. The optical axis 201 of the lens 20 is substantially aligned with the center 122 of the corresponding optical area 121 of the active optical component 12. Because the passive optical component 2 is formed independently of the encapsulant 14, the manufacturing tolerances related to forming the encapsulant 14 do not affect an offset between the optical axis 201 and the center 122.

To reduce pick-and-place tolerances related to positioning the passive optical component 2 on the encapsulant 14, fiducial mark(s) can be applied over or around the passive optical component 2. A pick-and-place tool, which can view the optical area 121 of the active optical component 12 due to transparency of the encapsulant 14, can use the fiducial mark(s) to align the optical axis 201 of the lens 20 with the center 122 of the optical area 121. This fiducial mark technique has been determined to provide good alignment between the optical axis 201 of the lens 20 and the center 122 of the optical area 121, as pick-and-place tools can have placement tolerances that are below about 10 micrometers (µm) (e.g., commercially available pick-and-place tools such as Datacon 2200 evo and Datacon 2200 evo-plus have placement tolerances of about 7 µm and 10 µm, respectively). These placement tolerances provide for positioning of the passive optical component 2 well within a desired offset tolerance between the optical axis 201 and the center 122 of below about 20 µm.

Because the passive optical component 2 is placed on the encapsulant 14 after the placement of the active optical component 12 and with reference to an actual position of the active optical component 12, the offset is not affected by manufacturing tolerances related to placing the active optical component 12 on the substrate 10. Thus, the desired offset tolerance below about 20 µm can be achieved without improving process tolerances (and thus manufacturing cost) associated with forming the encapsulant 14 or placing the active optical component 12 on the substrate 10.

Figure 2:
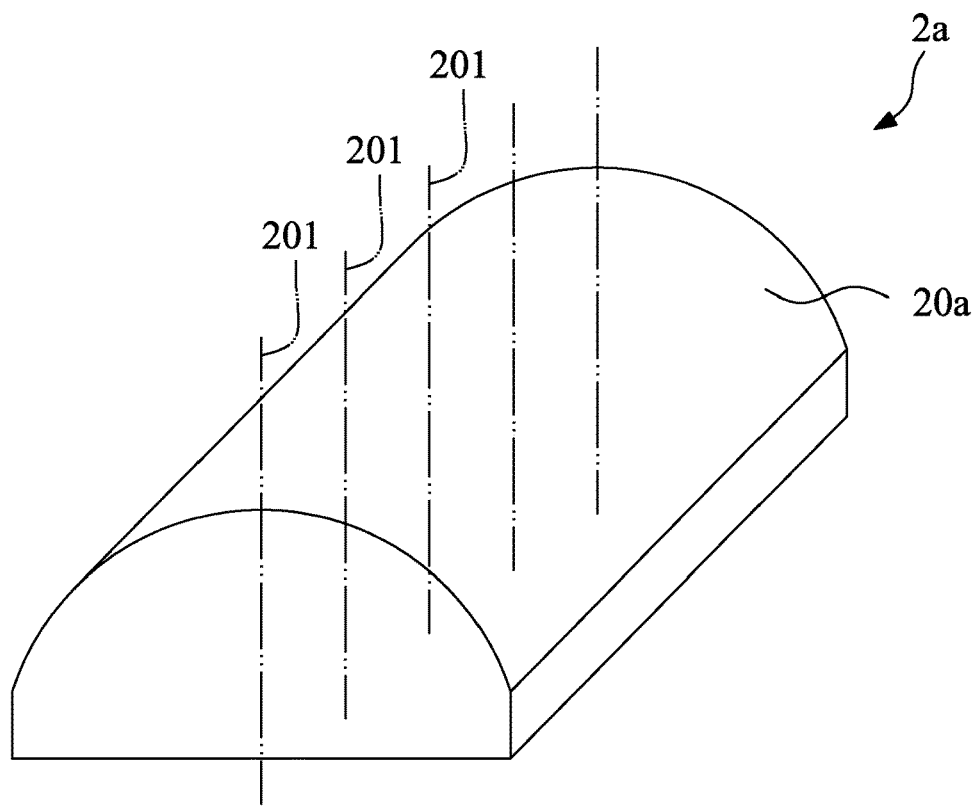
FIG. 2 depicts a perspective view of an example of a passive optical component according to an embodiment of the present disclosure.

FIG. 2 depicts a perspective view of an example of a passive optical component 2a according to an embodiment of the present disclosure. In one or more embodiments, such as the one shown in FIG. 2, the lens 20a of the passive optical component 2a has a half-cylindrical shape, and has a plurality of optical axes 201 that can be substantially aligned with centers of corresponding optical areas (such as the center 122 of the optical area 121 shown in FIG. 1) below the passive optical component 2a. In one or more other embodiments, such as the one shown in FIG. 1, the lens 20 of the passive optical component 2 has a substantially hemispherical shape.

Figure 3:
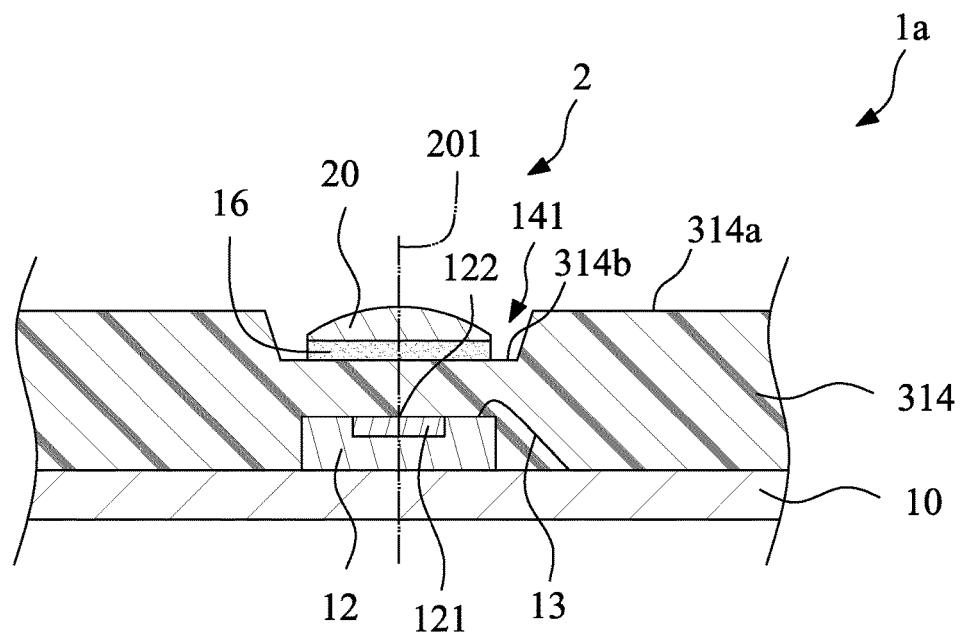
FIG. 3 depicts a cross-sectional view of an example of an optical device according to an embodiment of the present disclosure.

FIG. 3 depicts a cross-sectional view of an example of an optical device 1a according to an embodiment of the present disclosure. The optical device 1a is similar to the optical device 1 shown in FIG. 1, and similar features are numbered alike and not further described with respect to FIG. 3. In FIG. 3, an encapsulant 314 of the optical device 1a defines a cavity 141 above the active optical component 12. By comparison, the encapsulant 14 of the optical device 1 of FIG. 1 is substantially planar along an upper surface of the encapsulant 14. The cavity 141 in FIG. 3 extends from a first surface 314a of the encapsulant 314 to a second surface 314b of the encapsulant 314, where the first surface 314a and the second surface 314b are along separate planes. The passive optical component 2 is positioned in the cavity 141, on the second surface 314b. A dimension (e.g., diameter or surface area) of the second surface 314b is greater than a corresponding dimension (e.g., diameter or surface area) of the passive optical component 2. Because the passive optical component 2 is placed within the cavity 141, a total thickness of the optical device 1a, measured from a bottom of the substrate 10 to the top of the passive optical component 2, is less than a corresponding total thickness of the optical device 1 shown FIG. 1.

Figure 4:
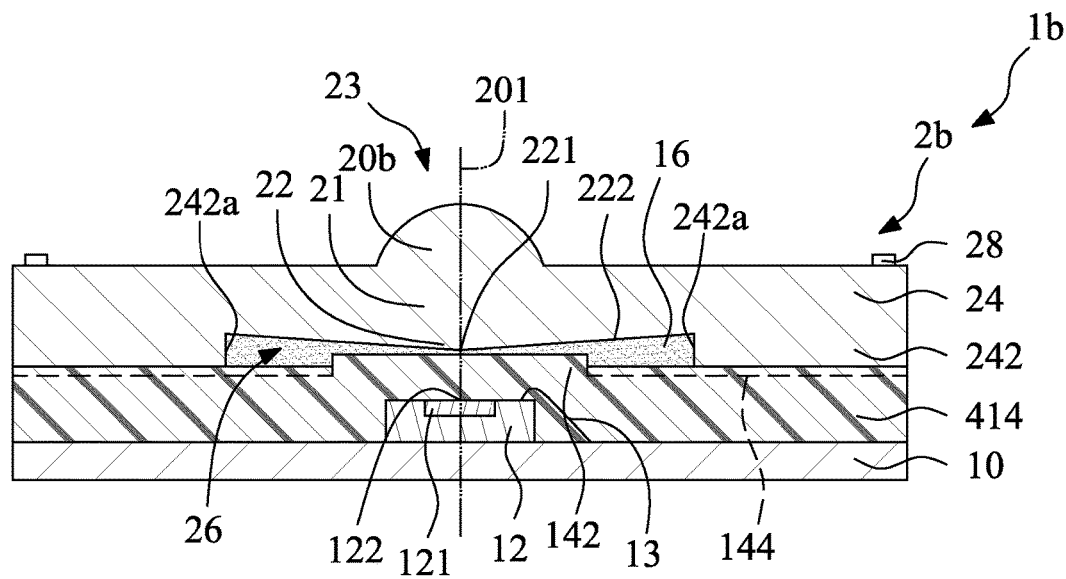
FIG. 4 depicts a cross-sectional view of an example of an optical device according to an embodiment of the present disclosure.

FIG. 4 depicts a cross-sectional view of an example of an optical device 1b according to an embodiment of the present disclosure. The optical device 1b of FIG. 4 is similar to the optical device 1 as shown in FIG. 1, and similar features are numbered alike and not further described with respect to FIG. 4. In FIG. 4, structures of a passive optical component 2b and an encapsulant 414 of the optical device 1b differ from respective structures of the passive optical component 2 and the encapsulant 14 of the optical device 1 of FIG. 1. In particular, the encapsulant 414 includes a platform 142 above the active optical component 12. In one or more embodiments, the encapsulant 414 and the platform 142 are formed integrally. The platform 142 protrudes above a remainder of the encapsulant 414; in other words, the platform 142 has a top surface along a plane that is at a greater distance from the substrate 10 than a plane of the remainder of the encapsulant 414.

The passive optical component 2b includes a main body 21 and a supporting structure 24. The main body 21 includes a light guiding portion 23 and at least one protruding portion 22 below the light guiding portion 23. In one or more embodiments, such as the embodiment shown in FIG. 4, the main body 21, the light guiding portion 23, the protruding portion 22, and the supporting structure 24 are integral to the passive optical component 2b (e.g., formed concurrently in a same process stage using a same material). The light guiding portion 23 includes a lens 20b. Note that although a single lens 20b is described with respect to FIG. 4, multiple lenses 20b may be included in the passive optical component 2b, and may be integral to the passive optical component 2b.

The protruding portion 22 has a shape that culminates in a point 221 lying along an optical axis 201 of the light guiding portion 23 (or the lens 20b). The protruding portion 22 includes one or more slanted surfaces 222. In one or more embodiments, the protruding portion 22 includes four slanted surfaces 222 that intersect with each other to form the point 221, such that the protruding portion 22 has a pyramid-like shape. In other embodiments, the protruding portion 22 includes three slanted surfaces 222 that intersect with each other to form the point 221, such that the protruding portion 22 has a shape similar to a triangular prism. In yet further embodiments, the protruding portion 22 includes two slanted lines that form an intersection line, which includes the point 221 in cross-section. In still other embodiments, the protruding portion 22 includes a single surface 222 which forms the point 221, such that the protruding portion 22 has a conical shape.

As shown in FIG. 4, the protruding portion 22 is positioned below the lens 20 and is in contact with the adhesive gel 16 deposited on the platform 142 of the encapsulant 414. During manufacture, an adhesive gel 16 is dispensed on the platform 142 of the encapsulant 414. Due to cohesive forces between the adhesive gel 16 and the top surface of the platform 142, the adhesive gel 16 will substantially remain on the top surface of the platform 142. The adhesive gel 16 will then distribute across a bottom surface of the passive optical component 2b after the passive optical component 2b is attached to the encapsulant 414. As the passive optical component 2b is pushed through the adhesive gel 16, the adhesive gel 16 is spread outwards by the protruding portion 22 and the adhesive gel 16 spills over sides of the platform 142. Thus, the adhesive gel 16 is disposed on and around the platform 142 and between the platform 142 and the protruding portion 22, as illustrated in FIG. 4.

The supporting structure 24 is attached to the main body 21 (or the lens 20b). In one or more embodiments, the supporting structure 24 is integral with the main body 21 and/or the lens 20b (e.g., integrally formed, such as formed concurrently in a same process stage using a same material). The supporting structure 24 includes a portion 242 extending in a downward direction (in the orientation of FIG. 4) and past the surface(s) 222 and the point 221 of the protruding portion 22 to form sidewalls 242a which define a cavity 26 of the passive optical component 2b. The platform 142 of the encapsulant 414 is enclosed within the cavity 26. The adhesive gel 16 may partially or fully fill the cavity 26. The portion 242 of the supporting structure 24 extends beyond the point 221 of the protruding portion 22 by an amount approximately equal to a height of the platform 142, so that the point 221 of the protruding portion 22 will come in contact with, or nearly come in contact with, the platform 142.

In one or more embodiments, the encapsulant 414 includes one or more recess portions 144 defined from a top surface of the encapsulant 414. A bottom of the portion 242 of the supporting structure 24 covers the recess portion 144 of the encapsulant 414, and is adhered to the encapsulant 414 by the adhesive gel 16 (e.g., which spreads into the recess portion 144 during manufacture) so as to increase adhesion between the passive optical component 2b and the encapsulant 414. Further, the portion 242 of the supporting structure 24 can prevent the light guiding portion 23 (or the lens 20b) of the passive optical component 2b from tilting, thereby ensuring that the optical axis 201 of the light guiding portion 23 (or the lens 20b) is substantially normal to the optical area 121.

As shown in FIG. 4, the passive optical component 2b may further include at least one fiducial mark 28 to facilitate alignment of the optical axis 201 with respect to a position of the center 122 of the optical area 121 during attachment of the passive optical component 2b to the encapsulant 414. The fiducial mark 28 may be a protrusion (as illustrated in FIG. 4) or a hole, and the position thereof may be on the main body 21 or the supporting structure 24.

During the manufacturing process, when the passive optical component 2b is attached to the encapsulant 414, formation of undesirable voids or air pockets in the adhesive gel 16 between the passive optical component 2b and the encapsulant 414 is mitigated. A cause of the formation of undesirable voids would be a flat bottom surface of the passive optical component 2b, when air pockets present either in the adhesive gel 16 or formed during attachment can become trapped beneath the passive optical component 2b. However, the shape of the protruding portion 22 in the embodiment of FIG. 4 allows for a release of air. For example, during the placement of the passive optical component 2b over the encapsulant 414, the adhesive gel 16 spreads laterally towards the sidewalls 242a along the surface 222 of the protruding portion 22 when the passive optical component 2b is pushed down on the encapsulant 414. As a result, air pockets are forced away from the area on the encapsulant 414 above the optical area 121 of the active optical component 12. Therefore, by including the protruding portion 22 of the passive optical component 2b as described above, formation of voids during manufacture that may otherwise affect optical efficiency of the optical device 1b may be reduced or even eliminated.

Figure 5:
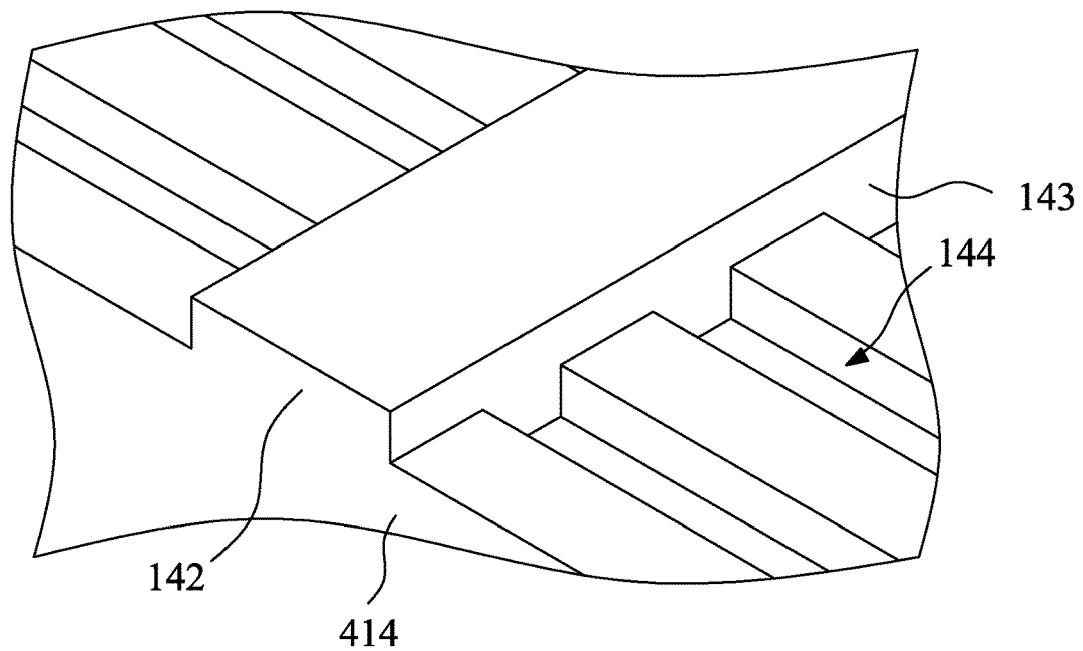
FIG. 5 depicts a perspective and partially enlarged view of the optical device shown in FIG. 4 according to an embodiment of the present disclosure.

FIG. 5 depicts a perspective and partially enlarged view of the encapsulant 414 shown in FIG. 4 according to an embodiment of the present disclosure. In FIG. 5, the encapsulant 414 defines multiple recess portions 144 for accommodating a portion of the adhesive gel 16. In this embodiment, the recess portions 144 extend substantially perpendicularly to an extension direction of the platform 142. In the embodiment illustrated in FIG. 5, a sidewall 143 of the platform 142 serves as an endwall for each of the recess portions 144. In other embodiments, the recess portions 144 may have endwalls separate from the sidewall 143 of the platform 142. Viewed in a direction substantially normal to the substrate 10, an area of the top surface of the encapsulant 414 occupied by the recess portions 144 can be less than an area of the top surface of the encapsulant 414 that makes contact with the passive optical component 2b. During the manufacturing process, when the passive optical component 2b is attached to the encapsulant 414, excess adhesive gel 16 can enter the recess portions 144. Thus, an amount of the adhesive gel 16 between the passive optical component 2b and the encapsulant 14 can be reduced. Therefore, the platform 142 and the recess portions 144 can reduce a bonding line thickness (BLT) between the passive optical component 2b and the encapsulant 414. As noted above, the adhesive gel 16 in the recess portions 144 can further provide additional adhesion between the encapsulant 414 and the passive optical component 2b.

Figure 6:
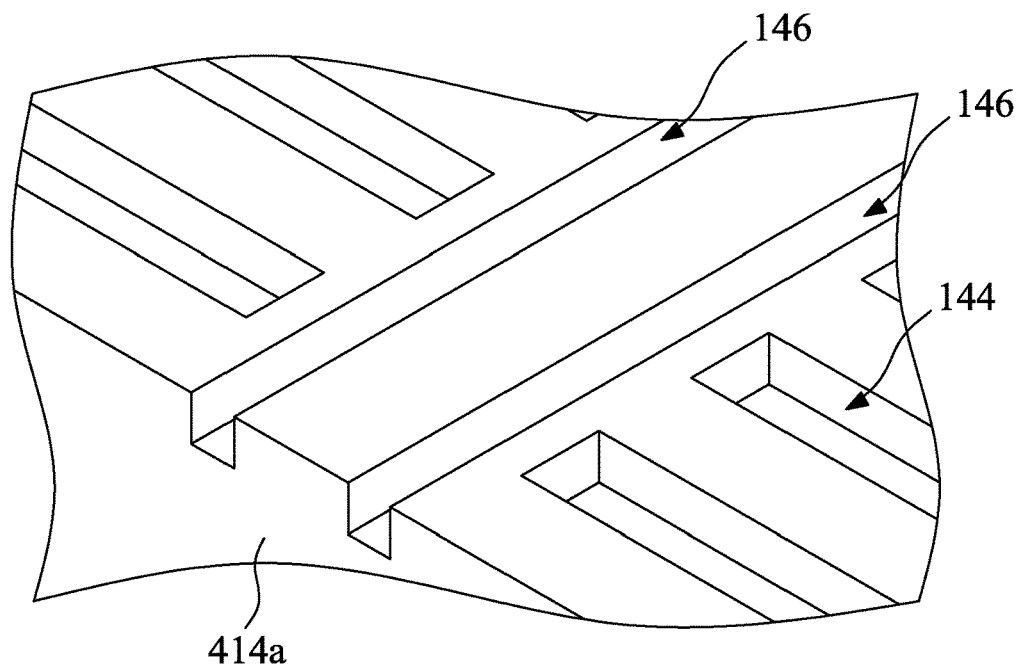
FIG. 6 depicts a perspective and partially enlarged view of the optical device shown in FIG. 4 according to an embodiment of the present disclosure.

FIG. 6 depicts a perspective and partially enlarged view of an example of an encapsulant 414a according to an embodiment of the present disclosure. The encapsulant 414a shown in FIG. 6 is similar to the encapsulant 414 shown in FIG. 5. However, in the embodiment shown in FIG. 6, the encapsulant 414a omits the raised platform 142 of the encapsulant 414 of FIG. 5, and the encapsulant 414a instead defines two substantially parallel grooves 146 extending in a first direction, and multiple recess portions 144 extending in second direction. In the embodiment illustrated in FIG. 6, the first direction and the second direction are substantially perpendicular, but may form other angles with respect to each other in other embodiments. The recess portions 144 do not intersect with the groove 146. A portion of the encapsulant 414a between the two grooves 146 can receive and confine the adhesive gel 16 in a manner similar to that discussed above in relation to the platform 142 shown in FIG. 5. The grooves 146, similar to the recess portion 144, can accommodate excess adhesive gel 16, and contribute towards reducing a bonding line thickness between the passive optical component 2b and the encapsulant 414a, as well as providing additional adhesion between a passive optical component (e.g., the passive optical component 2b) and the encapsulant 414a.

Figure 7:
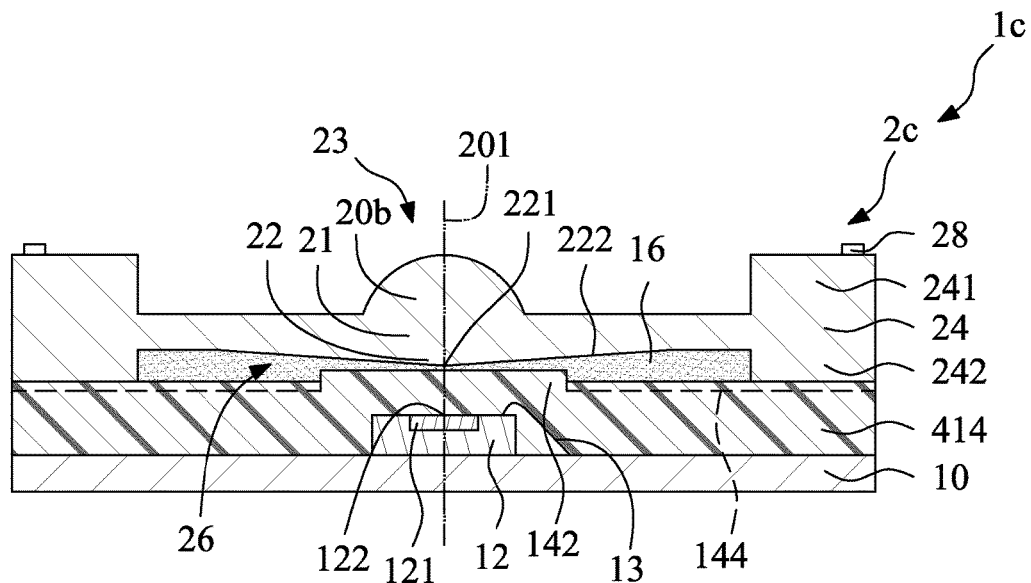
FIG. 7 depicts a cross-sectional view of an example of an optical device according to an embodiment of the present disclosure.

FIG. 7 depicts a cross-sectional view of an example of an optical device 1c according to an embodiment of the present disclosure. The optical device 1c shown in FIG. 7 is similar to the optical device 1b shown in FIG. 4, and similar features are numbered alike and not further described with respect to FIG. 7. In FIG. 7, a passive optical component 2c includes an upper protruding portion 241. The portion 241 extends in first direction that is away from the substrate 10. A top surface of the portion 241 is higher than the top of the light guiding portion 23 to protect the light guiding portion 23 from being scratched or damaged during manufacturing. The fiducial marks 28 are positioned on the top surface of the portion 241.

Figure 8:
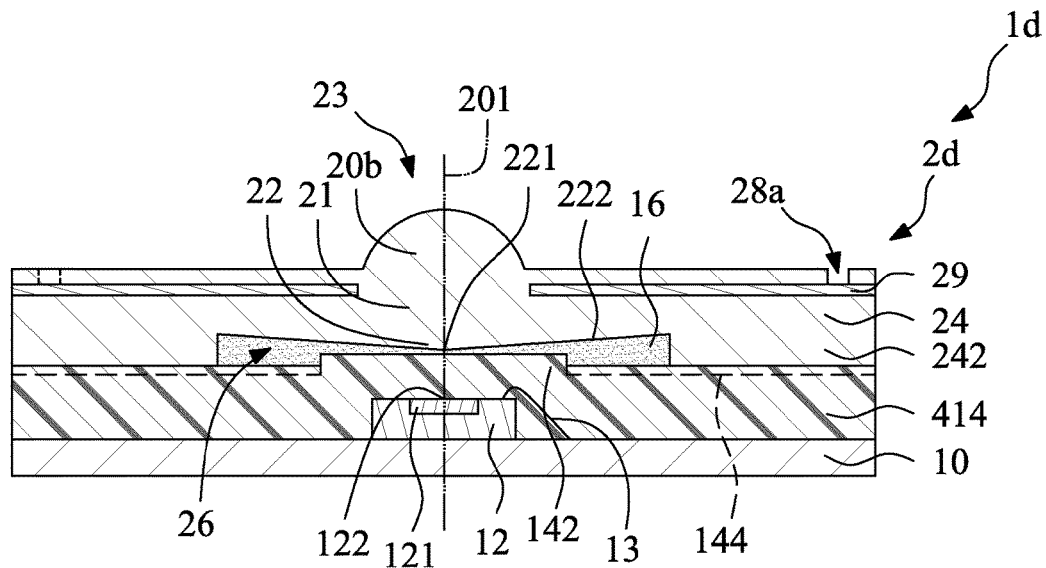
FIG. 8 depicts a cross-sectional view of an example of an optical device according to an embodiment of the present disclosure.

FIG. 8 depicts a cross-sectional view of an example of an optical device 1d according to an embodiment of the present disclosure. The optical device 1d shown in FIG. 8 is similar to the optical device 1b shown in FIG. 4, and similar features are numbered alike and not further described with respect to FIG. 8. In FIG. 8, a passive optical component 2d further includes an embedded metal layer 29. A fiducial mark 28a in the form of a hole exposes a portion of the metal layer 29. When the passive optical component 2d is picked up by a pick-and-place machine, the exposed metal layer 29 is recognized by a camera of the pick-and-place machine better than the camera recognizes other types of marks. Therefore, the pick-and-place machine can pick and place the passive optical component 2d with improved precision. In addition, the metal layer 29 enhances a rigidity of the passive optical component 2d.

Figure 9:
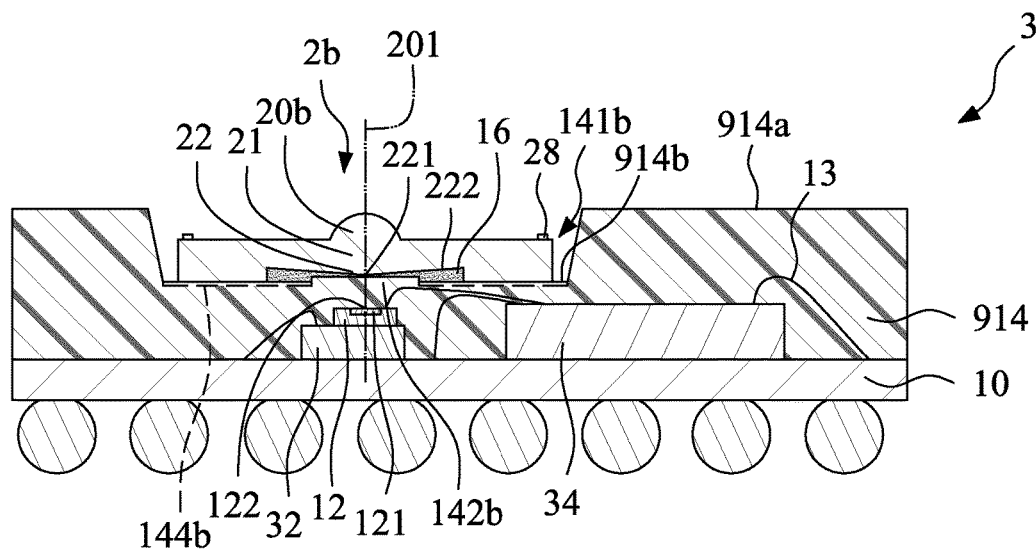
FIG. 9 depicts a cross-sectional view of an example of an electrical device according to an embodiment of the present disclosure.

FIG. 9 depicts a cross-sectional view of an example of an electrical device 3 according to an embodiment of the present disclosure. The electrical device 3 includes a substrate 10, an active optical component 12, an amplifier 32, a processing component 34, an encapsulant 914, an adhesive gel 16 and a passive optical component 2b (described with respect to FIG. 4). The amplifier 32 and the processing component 34 are positioned on the substrate 10 and are electrically connected to the substrate 10. In some embodiments, one or both of the amplifier 32 and the processing component 34 are in electrical connection with the substrate 10 through one or more bond wires 13. The active optical component 12 is a sensor die and is positioned on the amplifier 32. In one or more embodiments, the active optical component 12 is electrically connected to the processing component 34 by bond wires 13. The active optical component 12 of this embodiment may be similar to the active optical component 12 as shown in FIGS. 1, 3, 4, and 7, and has at least one optical area 121 for detecting a light beam and in response generating a corresponding electrical signal. The amplifier 32 is electrically connected to the active optical component 12 for amplifying the electrical signal. The processing component 34 is electrically connected to the amplifier 32 and/or the active optical component 12 for processing the electrical signal. In some embodiments, an optical area 121 is arranged to detect light within a narrow range of wavelengths, and in other embodiments, the optical area 121 is arranged to detect light over a broadband range of wavelengths.

The encapsulant 914 covers the active optical component 12, the amplifier 32 and the processing component 34. The encapsulant 914 also defines a cavity 141b above the active optical component 12 for accommodating the passive optical component 2b. The cavity 141b extends from a first surface 914a of the encapsulant 914 to a second surface 914b of the encapsulant 914, where the first surface 914a and the second surface 914b are along separate planes. The passive optical component 2b is positioned in the cavity 141b on the second surface 914b. A dimension (e.g., diameter or surface area) of the second surface 914b of the cavity 141b is greater than a corresponding dimension (e.g., diameter or surface area) of the passive optical component 2b.

The encapsulant 914 includes a platform 142b and at least one recess portion 144b at the second surface 914b of the cavity 141b, similar to the platform 142 and at least one recess portion 144 shown in FIG. 4.

The passive optical component 2b is positioned above the platform 142 and contacts the adhesive gel 16. The recess portion 144b accommodates a portion of the adhesive gel 16. In one or more embodiments, the passive optical component 2b is positioned on the recess portion 144b to contact the adhesive gel 16.

The passive optical component 2b is adhered to the encapsulant 914 above the active optical component 12 by the adhesive gel 16. The passive optical component 2b has an optical axis 201, and the optical axis 201 is substantially aligned with a center 122 of the corresponding optical area 121 of the active optical component 12. In one or more embodiments, the passive optical component 2b may include multiple light guiding portions (e.g., multiple light guiding portions 23 as illustrated in FIG. 4), and each of the light guiding portions has an optical axis 201. An offset associated with the optical axis 201 of the passive optical component 2b and the center 122 of the optical area 121 is less than about 20 µm. In one or more embodiments, the passive optical component 2b may be replaced by the passive optical component 2 shown in FIG. 1, the passive optical component 2a shown in FIG. 2, or the passive optical component 2 shown in FIG. 3.

FIGS. 10-13 depict cross-sectional views of an example optical device at various stages during an example method for manufacturing the optical device, according to an embodiment of the present disclosure.

Figure 10:
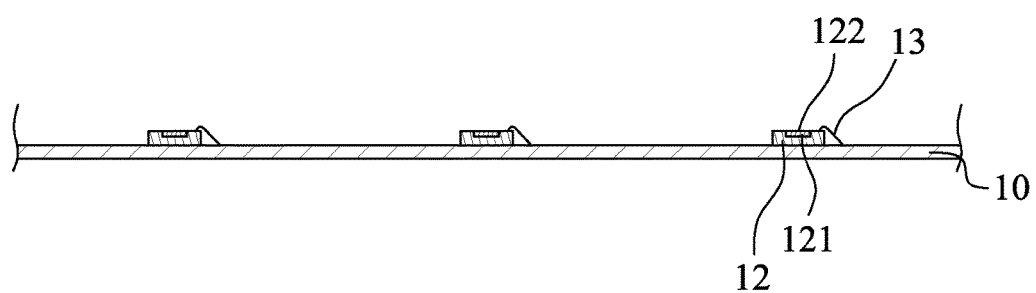
FIG. 10, FIG. 11, FIG. 12, and FIG. 13 depict cross-sectional views of an example of various stages of manufacture of an optical device according to an embodiment of the present disclosure.

Referring to FIG. 10, a substrate 10 and at least one active optical component 12 are provided. The at least one active optical component 12 is positioned on the substrate 10. In one or more embodiments, the active optical component 12 is electrically connected to the substrate 10 by one or more wires 13. The active optical component 12 includes at least one optical area 121 with a center 122. In one or more embodiments, the active optical component 12 is a sensor, and the optical area 121 is a sensing area for detecting a light beam. In other embodiments, the active optical component 12 is a light source, and the optical area 121 is a light-emitting area for emitting a light beam.

Figure 11:
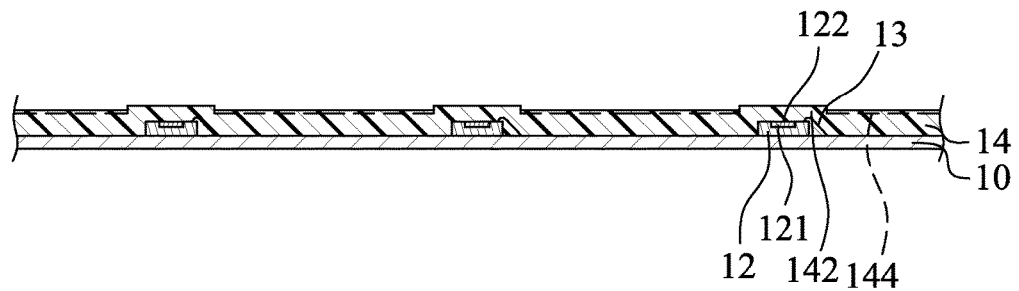

Referring to FIG. 11, an encapsulant 14 is formed to cover the active optical component 12 and a surface of the substrate 10. In one or more embodiments, the encapsulant 14 is transparent. The encapsulant 14 includes at least one platform 142 above the active optical component 12. The encapsulant 14 defines at least one recess portion 144.

Figure 12:
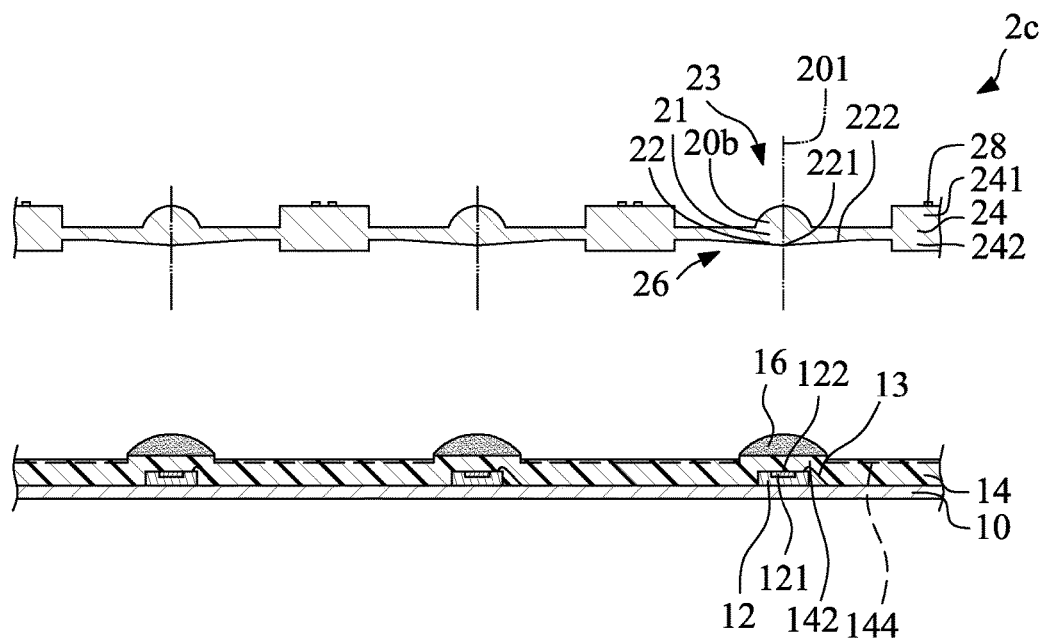

Referring to FIG. 12, an adhesive gel 16 is applied on the encapsulant 14. In one or more embodiments, such as the one shown in FIG. 12, the adhesive gel 16, which is in a liquid state, is dispensed over the platform 142. Due to cohesion forces between the adhesive gel 16 and the top surface of the platform 142, the adhesive gel 16 remains substantially confined to the top surface of the platform 142. Thus, an amount of the adhesive gel 16 deposited on the encapsulant 14 can be controlled.

Then, passive optical components 2c arranged in an array or in a column are provided. Each of the passive optical components 2c includes a main body 21 and a supporting structure 24. The main body 21 includes a light guiding portion 23 and a protruding portion 22 below the light guiding portion 23. In one or more embodiments, such as the embodiment shown in FIG. 12, the main body 21, the light guiding portion 23, the protruding portion 22, and the supporting structure 24 are integral to the corresponding passive optical component 2b (e.g., formed concurrently in a same process stage using a same material). The light guiding portion 23 includes at least one lens 20. The protruding portion 22 has a shape that culminates in a point 221 lying along an optical axis 201 of the light guiding portion 23 (or the lens 20). One or more surfaces 222 of the protruding portion 22 are similar to those described with respect to FIG. 4, and are not described again.

The supporting structure 24 is attached to the main body 21 (or the lens 20). Similar to the supporting structure 24 shown in FIG. 7, the supporting structure 24 shown in FIG. 12 includes a portion 241 and a portion 242. The portion 241 extends in a first direction (upward direction in FIG. 12), and a top surface of the portion 241 is higher than a topmost portion of the light guiding portion 23 to protect the light guiding portion 23 (or the lens 20) from getting scratched or damaged during manufacturing. The portion 242 extends in a second direction (downward direction in FIG. 12) opposite to the first direction, and past the surface 222 and the point 221 of the protruding portion 22 to form a cavity 26. The portion 242 of the supporting structure 24 extends beyond the point 221 of the protruding portion 22 by an amount approximately equal to a height of the platform 142 of the encapsulant 14, such that the point 221 of the protruding portion 22 will come in contact with, or nearly come in contact with, the platform 142 when the passive optical components 2c are placed on the encapsulant 14. In one or more embodiments, such as the one shown in FIG. 12, the passive optical component 2c is made using a transfer molding process, which has process tolerances of about 1 µm to about 2 µm.

Figure 13:
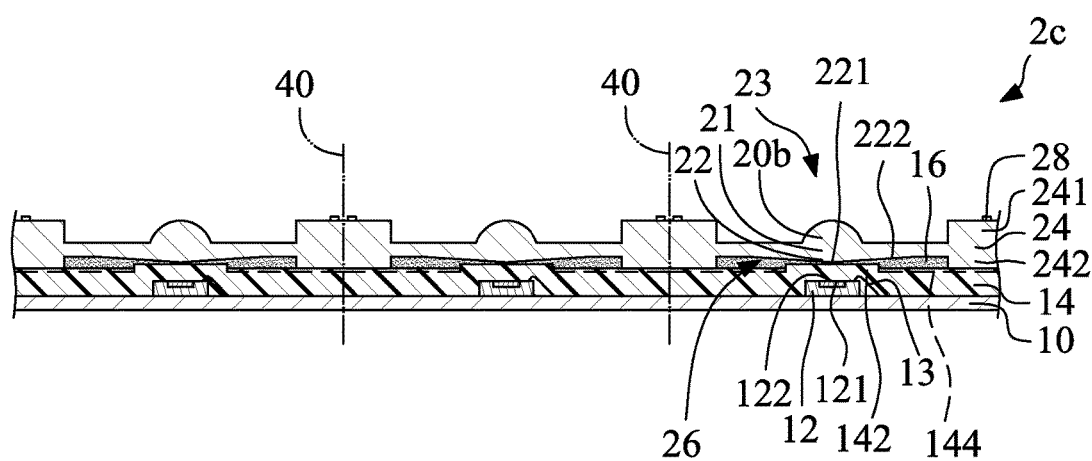

Referring to FIG. 13, the passive optical components 2c are attached to the encapsulant 14. The optical axis 201 is substantially aligned with the center 122 of the corresponding optical area 121 of the active optical component 12. The platform 142 of the encapsulant 14 is disposed in the cavity 26, and the adhesive gel 16 substantially fills the cavity 26. In addition, excess amount of the adhesive gel 16 enters the recess portion 144. Thus, an amount of the adhesive gel 16 between the passive optical component 2c and the encapsulant 14 can be controlled. Therefore, a design of the platform 142 and the recess portion 144 can control a bonding line thickness (BLT) between the passive optical component 2c and the encapsulant 14. The bottom of the portion 242 of the supporting structure 24 covers the recess portion 144 of the encapsulant 14, and is adhered to the encapsulant 14 by the adhesive gel 16 to increase adhesion between the passive optical component 2c and the encapsulant 14. In one or more embodiments, the portion 242 of the supporting structure 24 can prevent the light guiding portion 23 (or the lens 20) of the passive optical component 2c from tilting.

In one or more embodiments, the passive optical component 2c is aligned with the active optical component 12 during a pick-and-place procedure. In one or more embodiments, the pick-and-place procedure uses a camera to locate fiducial marks 28 on the passive optical component 2c to precisely locate and place the passive optical components 2c over the encapsulant 14 such that the optical axes of the lenses 20 are precisely aligned with the centers 122 of respective optical components 12. The use of fiducial marks 28 aids in reducing an offset tolerance of the pick-and-place procedure. For example, an offset tolerance of a Datacon 2200 evo bonder is about 10 and an offset tolerance of a Datacon 2200 evo plus bonder is about 7 µm. Therefore, an offset tolerance between the optical axis 201 of the passive optical component 2c and the center 122 of the optical area 121 of the active optical component 12 can be less than 20 µm. Because the offset tolerance does not relate to the pick-and-place alignment tolerance of the active optical component 12 onto the substrate 10 or a mold tool tolerance of the encapsulant 14, an improved alignment capability of a die bonder and a new design of a mold tool are not necessary.

In one or more embodiments, during attaching of the passive optical component 2c to the encapsulant 14, undesirable voids may occur in the adhesive gel 16 between the passive optical component 2c and the encapsulant 14. A cause of the formation of undesirable voids, especially if a bottom surface of the passive optical component 2c were flat, is that air pockets present either in the adhesive gel 16 or formed during attachment may get trapped beneath the passive optical component 2c. However, the shape of the protruding portion 22 allows for a release of air during attachment. For example, during the placement of the passive optical component 2c over the encapsulant 14, the adhesive gel 16 spreads laterally along the surface 222 of the protruding portion 22 when the passive optical component 2c is pushed down on the encapsulant 14. As a result, air pockets are forced away from the area on the encapsulant 14 above the optical area 121 of the active optical component 12. Therefore, by including the protruding portion 22 of the passive optical component 2c as described above, formation of voids during manufacture that may otherwise affect the optical efficiency of the optical device may be reduced or even eliminated.

In one or more embodiments, the manufacturing process can also include a dicing or singulation process to divide the substrate 10 containing multiple optical devices into singular optical devices. In one or more embodiments, the dicing or singulation process includes using a blade to cut along cutting lines 40 such that multiple separate optical devices similar to the optical device 1c shown in FIG. 7 are obtained.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated by such arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. An optical device, comprising:
an active optical component comprising an optical area;
an encapsulant covering the active optical component and comprising a platform disposed above the active optical component, wherein the platform protrudes above a remainder of the encapsulant, the encapsulant defines a recess portion, and the encapsulant is a monolithic structure;
a passive optical component adhered to the encapsulant above the active optical component, wherein the passive optical component has an optical axis, the optical axis is substantially aligned with a center of the optical area, and an area of a surface of the encapsulant including the recess portion facing the passive optical component is less than an area of a surface of the passive optical component facing the encapsulant; and
an adhesive gel, wherein the passive optical component is positioned over the recess portion of the encapsulant and in contact with the adhesive gel.

2. The optical device of claim 1, wherein the active optical component is a sensor or a light source, the optical area is a sensing area for detecting a first light beam or a light-emitting area for emitting a second light beam, the encapsulant allows the first light beam or the second light beam to pass through, and the passive optical component includes a lens having the optical axis.

3. The optical device of claim 1, further comprising a substrate, wherein the active optical component is positioned on and electrically connected to the substrate.

4. The optical device of claim 1, wherein a distance between the center of the optical area and a point on the optical area where the optical axis of the passive optical component intersects the optical area is less than 20 μm.

5. The optical device of claim 1, wherein a dimension of a surface of the platform facing the passive optical component is less than a corresponding dimension of a surface of the passive optical component facing the encapsulant, and the passive optical component is positioned above the platform.

6. The optical device of claim 1, wherein the passive optical component includes:
  a lens;
  a protruding portion below the lens; and
  a supporting structure attached to the lens, wherein the supporting structure comprises a second portion extending past a surface of the protruding portion to form a cavity.

7. The optical device of claim 6, wherein the protruding portion has a shape that culminates in a point lying along the optical axis of the lens.

8. An electrical device, comprising:
  a sensor comprising a sensing area configured to detect a light beam and responsively generate an electrical signal;
  an amplifier electrically connected to the sensor and configured to amplify the electrical signal;
  a processing component electrically connected to the amplifier and configured to process the amplified electrical signal;
  an encapsulant covering the sensor, the amplifier and the processing component, and comprising a platform disposed above the sensor, wherein the platform protrudes above a remainder of the encapsulant, the encapsulant defines a recess portion, and the encapsulant is a monolithic structure;
  a passive optical component adhered to the encapsulant above the sensor, wherein the passive optical component has an optical axis, and wherein the optical axis is substantially aligned with a center of the sensing area, and an area of a surface of the encapsulant including the recess portion facing the passive optical component is less than an area of a surface of the passive optical component facing the encapsulant; and
  an adhesive gel, wherein the passive optical component is positioned over the recess portion of the encapsulant and in contact with the adhesive gel.

9. The electrical device of claim 8, further comprising a substrate, wherein the amplifier and the processing component are positioned on and electrically connected to the substrate.

10. The electrical device of claim 8, wherein a distance between the center of the sensing area and a point on the sensing area where the optical axis of the passive optical component intersects the sensing area is less than 20 μm.

11. The electrical device of claim 8, wherein an area of a surface of the platform facing the passive optical component is less than the area of a surface of the passive optical component facing the encapsulant, and the passive optical component is positioned above the platform.

12. The electrical device of claim 8, wherein the passive optical component comprises:
  a main body including a light guiding portion and a protruding portion positioned below the light guiding portion; and
  a supporting structure attached to the main body, wherein a portion of the supporting structure extends past a surface of the protruding portion to form a cavity,
  wherein the optical axis is an optical axis of the light guiding portion.

13. The electrical device of claim 12, wherein the light guiding portion comprises a lens.

14. The electrical device of claim 12, wherein the light guiding portion and the protruding portion are formed integrally.

15. The electrical device of claim 12, wherein the protruding portion has a shape that culminates in a point lying along the optical axis.

16. The electrical device of claim 12, wherein the supporting structure comprises a first portion and a second portion, the first portion extends in a first direction past a farthest extent of the light guiding portion, and the second portion extends in a second direction opposite the first direction and past a farthest extent of the protruding portion to form the cavity.

* * * * *